United States Patent
Atanakovic

(10) Patent No.: US 7,825,470 B2
(45) Date of Patent: Nov. 2, 2010

(54) TRANSISTOR AND IN-SITU FABRICATION PROCESS

(76) Inventor: Petar B. Atanakovic, 1050 Waverley St., Palo Alto, CA (US) 94301

( * ) Notice: Subject to any disclaimer, the term of this patent is extended or adjusted under 35 U.S.C. 154(b) by 8 days.

(21) Appl. No.: 12/331,288

(22) Filed: Dec. 9, 2008

(65) Prior Publication Data
US 2009/0085115 A1    Apr. 2, 2009

Related U.S. Application Data

(62) Division of application No. 11/053,785, filed on Feb. 9, 2005, now Pat. No. 7,498,229.

(51) Int. Cl.
*H01L 27/12* (2006.01)
(52) U.S. Cl. .............................. 257/347; 257/E29.295
(58) Field of Classification Search .............. 257/347, 257/E29.295
See application file for complete search history.

(56) References Cited

U.S. PATENT DOCUMENTS 4,479,297 A * 10/1984 Mizutani et al. ............ 438/152

2003/0183885 A1 * 10/2003 Nishikawa et al. .......... 257/410

OTHER PUBLICATIONS

K N. Tu, et al. "Low Schottky barrier of rare-earth silicide on n-Si", Appl. Phys. Lett. 38, pp. 626-628 (1981).*

* cited by examiner

*Primary Examiner*—Matthew C Landau
*Assistant Examiner*—Sonya D McCall-Shepard
(74) *Attorney, Agent, or Firm*—Parsons & Goltry; Robert A. Parsons; Michael W. Goltry

(57) ABSTRACT

A method of fabricating semiconductor components in-situ and in a continuous integrated sequence includes the steps of providing a single crystal semiconductor substrate, epitaxially growing a first layer of rare earth insulator material on the semiconductor substrate, epitaxially growing a first layer of semiconductor material on the first layer of rare earth insulator material, epitaxially growing a second layer of rare earth insulator material on the first layer of semiconductor material, and epitaxially growing a second layer of semiconductor material on the second layer of rare earth insulator material. The first layer of rare earth insulator material, the first layer of semiconductor material, the second layer of rare earth insulator material, and the second layer of semiconductor material form an in-situ grown structure of overlying layers. The in-situ grown structure is etched to define a semiconductor component and electrical contacts are deposited on the semiconductor component.

2 Claims, 3 Drawing Sheets

TRANSISTOR AND IN-SITU FABRICATION PROCESS

CROSS-REFERENCE TO RELATED APPLICATIONS

This application is a divisional application of currently pending U.S. application Ser. No. 11/053,785, filed 9 Feb. 2005.

FIELD OF THE INVENTION

This invention relates to semiconductor components, and especially FETs, epitaxially grown on an insulating layer and the fabrication process.

BACKGROUND OF THE INVENTION

Complimentary metal oxide semiconductor (CMOS) structures are the core active elements of modern electronics. Undoubtedly, the major material enabling features of Si CMOS are the superb quality of the native silicon dioxide ($SiO_2$), $Si/SiO_2$ interface and high crystalline perfection of the Si substrates. The field effect transistor (FET) implemented as CMOS is scalable. That is, speed and complexity improves with decreasing device feature sizes. This concept makes CMOS architecture a powerful methodology. Deep submicron room-temperature bulk Si CMOS is presently the main technology used for ultra large scale integrated circuits (ULSICs).

Continued scaling of current CMOS architecture is reaching the limits of the material properties of both the $SiO_2$ gate dielectric and bulk Si substrate. Silicon-on-insulator (SOI) substrates offer solutions to both ULSI scaling and high performance wireless architectures. High frequency ULSI requires SOI for reduction in the number of processing steps, reduction of substrate leakage current coupling between FET's reducing parasitic capacitances and latchup, formation of shallow junctions, isolation of clock noise and functional regions on chip, etc. SOI CMOS offers a 20-35% performance gain over conventional bulk Si CMOS.

Various attempts have been made at implementing a viable SOI material, with practically all methods focusing on the formation of a relatively thin active layer of Si separated from a substrate material using an insulator or the insulator itself being the substrate. It will be understood by those skilled in the art that the active layer is formed of single crystal silicon (SC) or other well known semiconductor material. In this disclosure the term "crystalline silicon" is also used to denote a layer of silicon that is substantially single crystal material, i.e. as much of a single crystal as can be formed using present day techniques. Early attempts used laser or e-beam recrystallization of amorphous Si into single crystal Si which was deposited on sapphire, quartz or other glass substrates. The results were far from ideal and typically resulted in a domain/polycrystalline active layer with poor uniformity.

Ion implantation of oxygen or nitrogen (or even both) through the surface of a bulk Si substrate has proven to be an efficient method of realizing buried oxide (BOX) layers beneath an active Si layer. Silicon dioxide possesses a very wide band gap, large conduction/valence band offsets with Si and readily forms a thermal oxide when Si atoms are in an oxygen environment. $SiO_2$ is therefore an obvious choice as an insulator material and thus oxygen ion implantation is preferred. High densities of spatially localized oxygen ions can be produced at well controlled depths beneath the Si surface. However, the energetic implanted ions produce a highly defective topmost Si active layer. An aggressive post implant thermal annealing campaign is required to recrystallize the active layer back into low defect density single crystal Si. The result is a single crystal Si active layer on buried oxide insulator layer. However, by its very nature of fabrication this process is limited in the maximum thickness of oxide which can be created beneath the active layer of Si. Further, as understood by those skilled in the art this process is very work intensive with many steps and is therefore expensive and subject to errors.

Recently, a bond and etch back technology has been demonstrated which combines implantation with wafer bonding. It can also potentially offer thick BOX layers. A silicon wafer surface is oxidized to form $SiO_2$ and then implanted with $H^+$ ions to form a relatively uniform thin layer beneath the surface. The wafer is bonded to a second bulk Si wafer initially via Van der Waal's forces. The combined bonded wafer structure is then cleaned and thermally activated such that the $H^+$ ions react to form water and voids/blisters which subsequently forms an atomic cleave plane defined by the hydrogen implant. This technique allows transfer of a thin layer of single crystal Si and amorphous oxide onto a second wafer resulting in an SOI structure. However, to achieve a thin active layer with a sufficiently smooth surface, extensive use of surface polishing is required at the cleaved surface. Chemical mechanical polishing (CMP) and even argon cluster sputtering are used to define the final roughness which can potentially approach that of bulk Si wafers. Further, extensive annealing is required at ~1100° C. to strengthen bonding and remove defects. This is a costly, complex process and produces unwanted defects.

Another problem with the crystalline silicon on a silicon dioxide insulating layer is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. Some components can be formed in the crystalline layer that use this compressive stress to an advantage, however, since the compressive stress will be across the entire wafer it will affect all components formed in/on the crystalline layer, many to a highly undesirable degree. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). However, the result is a layer of silicon dioxide that is too thick to be of use in many applications, such as gate oxides in very small field effect transistors and the like.

Also, because the silicon dioxide layer allows some migration of impurities into the active layer from the substrate (handle wafer) both of the substrates must be high quality wafers, which adds substantial expense. Further, the silicon dioxide may contain impurities (e.g. hydrogen molecules introduced during the oxidation process) that can migrate into the active layer.

It would be highly advantageous, therefore, to remedy the foregoing and other deficiencies inherent in the prior art.

Accordingly, it is an object of the present invention to provide new and improved method of fabricating semiconductor components in-situ (i.e. without removing the structure from the epitaxial chamber) and in a continuous integrated sequence.

Another object of the invention is to provide new and improved semiconductor-on-insulator semiconductor components.

Another object of the invention is to provide new and improved semiconductor-on-insulator semiconductor components with insulating layers having improved characteristics.

SUMMARY OF THE INVENTION

Briefly, to achieve the desired objects of the instant invention in accordance with a preferred embodiment thereof, provided is a method of fabricating semiconductor components in-situ and in a continuous integrated sequence. The method includes the steps of providing a single crystal semiconductor substrate, epitaxially growing a first layer of rare earth insulator material on the semiconductor substrate, epitaxially growing a first layer of semiconductor material on the first layer of rare earth insulator material, epitaxially growing a second layer of rare earth insulator material on the first layer of semiconductor material, and epitaxially growing a second layer of semiconductor material on the second layer of rare earth insulator material. The first layer of rare earth insulator material, the first layer of semiconductor material, the second layer of rare earth insulator material, and the second layer of semiconductor material form an in-situ grown structure of overlying layers. The in-situ grown structure is etched to define a semiconductor component and electrical contacts are deposited on the semiconductor component.

In a specific embodiment, a semiconductor-on-insulator field effect transistor (FET) is formed by the new method of fabricating semiconductor components in-situ and in a continuous integrated sequence. The method of fabricating the FET includes providing a single crystal silicon substrate, epitaxially growing a buried insulator layer of rare earth insulator material on the semiconductor substrate, epitaxially growing a channel layer of single crystal silicon on the buried insulator layer of rare earth insulator material, epitaxially growing a gate insulator layer of rare earth insulator material on the channel layer, epitaxially growing a gate stack of silicon on the gate insulator layer, and epitaxially growing a contact layer of rare earth silicide on the gate stack. The buried layer, the channel layer, the gate insulator layer, the gate stack, and the contact layer form an in-situ grown structure. The in-situ grown structure is etched through the contact layer, the gate stack and the gate insulator layer to define a gate stack, a drain region in the channel layer adjacent one side of the gate stack, and a source region in the channel layer adjacent an opposite side of the gate stack. A portion of the channel layer in the drain region is doped for conduction and a portion of the channel layer in the source region is doped for conduction. The doping in both the drain region and the source region extends through the channel layer to the buried insulator layer to provide a fully depleted channel layer. A metal gate contact is deposited on the gate stack, a metal drain contact is deposited on the doped portion of the channel layer in the drain region, and a metal source contact is deposited on the doped portion of the channel layer in the source region. The resulting FET is fully depleted.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
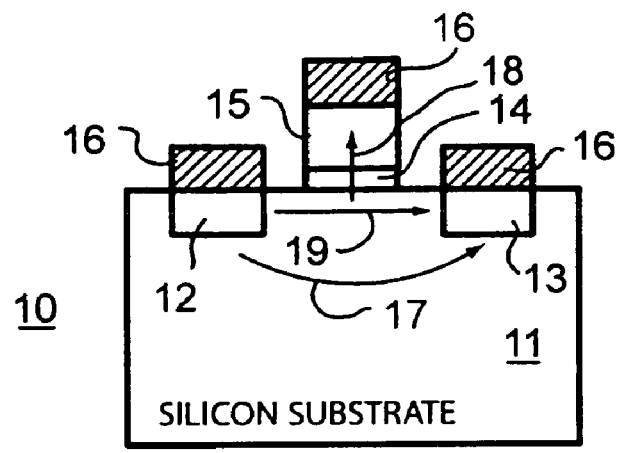
FIG. 1 is a simplified sectional view of a standard transistor on a silicon substrate.

Turning now to the drawings, attention is first directed to FIG. 1, which illustrates a simplified sectional view of a standard field effect transistor 10 as known in the art. Transistor 10 is formed directly on a silicon substrate 11 by forming spaced apart p and n wells 12 and 13, respectively, in the surface of substrate 11. A thin gate oxide layer 14 is formed on the surface of substrate 11 between wells 12 and 13 and a gate stack 15 is formed on oxide layer 14. Metal contacts 16 are formed on each of wells 12 and 13 and on gate stack 15 by a well known metallization process.

As is known in the art, one major problem with transistor 10 is direct leakage between wells 12 and 13 through the bulk of substrate 10, depicted by arrow 17. This leakage severely limits the minimum spacing that can be provided between wells 12 and 13 and, thus, severely limits the minimum size of transistor 10. Also, gate oxide layer 14 allows current leakage, depicted by arrow 18, from the desired current path, depicted by arrow 19, into the gate circuit. This current leakage occurs because gate oxide layer 14 is traditionally silicon dioxide, which is a relatively poor insulator and because it is highly desirable to make the gate oxide layer as thin as possible to reduce the required gate control voltage.

Figure 2:
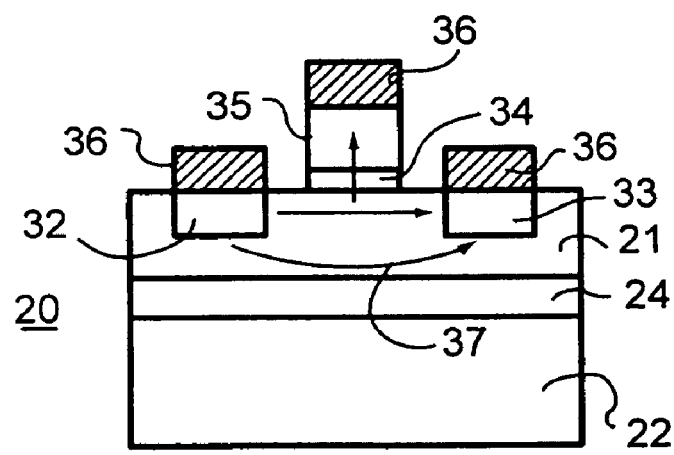
FIG. 2 is a simplified sectional view of a transistor formed in a crystalline layer on a partially depleted silicon dioxide insulating layer.

The semiconductor industry has attempted to solve some of the above problems by forming a transistor 20 on/in a partially depleted crystalline silicon layer 21 formed on a silicon dioxide insulating layer 24, known in the industry as silicon-on-insulator (SOI). In this disclosure the term "crystalline silicon" is used to denote a layer of silicon that is substantially single crystal material, i.e. as much of a single crystal as can be formed using present day techniques. As illustrated in FIG. 2, a silicon substrate 22 is provided with silicon dioxide layer 24 and crystalline silicon layer 21 by any convenient method, such as that described in U.S. Pat. No. 6,372,609, entitled "Method of Fabricating SOI Wafer by Hydrogen ION Delamination Method and Wafer Fabricated by the Method", issued Apr. 16, 2002. Transistor 20 is formed on crystalline silicon layer 21 by forming spaced apart p and n wells 32 and 33, respectively, in the surface of layer 21. A thin gate oxide layer 34 is formed on the surface of layer 21 between wells 32 and 33 and a gate stack 35 is formed on oxide layer 34. Metal contacts 36 are formed on each of wells 32 and 33 and on gate stack 35 by a well known metallization process.

Partially depleted crystalline silicon layer 21 formed on silicon dioxide insulating layer 24 only partially solves the problems outlined above because, for one reason, some direct leakage between wells 32 and 33 still occurs through partially depleted crystalline silicon layer 21, depicted by arrow 37. This leakage is still great enough to limit the minimum spacing that can be provided between wells 32 and 33 and, thus, limits the minimum size of transistor 20. Also, the leakage of gate oxide layer 34 has not been altered and, therefore, the thickness of gate oxide layer 34 cannot be reduced further in this structure.

Figure 3:
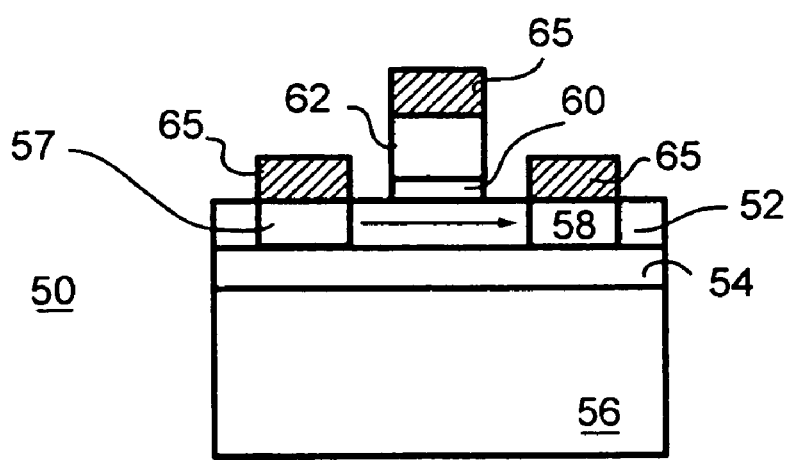
FIG. 3 is a simplified sectional view of a transistor formed in a crystalline layer on a fully depleted insulating layer in accordance with the present invention.

Turning to FIG. 3, a simplified sectional view of a transistor 50 formed in/on a crystalline layer 52 on a fully depleted insulating layer 54 on a silicon substrate 56, in accordance with the present invention, is illustrated. Transistor 50 is formed in/on crystalline layer 52 by forming spaced apart p and n conduction areas 56 and 58, respectively, in crystalline layer 52. Because crystalline layer 52 is extremely thin (e.g. generally in a range of 150 to 500 angstroms) conduction areas 56 and 58 reach from the surface to insulating layer 54 (fully depleted) and can be formed in any of variety of very simple processes, such as low energy implanting particles, infusion or migration from material deposited on the surface, etc. A thin gate insulating layer 60 is formed on the surface of crystalline layer 52 between conduction areas 56 and 58 and a gate stack 62 is formed on gate insulating layer 60. Metal contacts 65 are formed on each of conduction areas 56 and 58 and on gate stack 62 by any convenient metallization process.

Turning now to FIGS. 4 through 7, various steps for fabricating a semiconductor component on an SOI structure in-situ in one integrated sequence by an epitaxial growth process is illustrated. It should be understood that all of the steps illustrated in FIGS. 4-7 are performed in-situ (i.e. without removing the structure from the epitaxial chamber) and in a continuous integrated sequence. Further, while a single field effect transistor is illustrated for purposes of this explanation, it will be understood that at least a complete wafer will generally be included and many similar and many different components can be formed simultaneously on the wafer.

Figure 4:
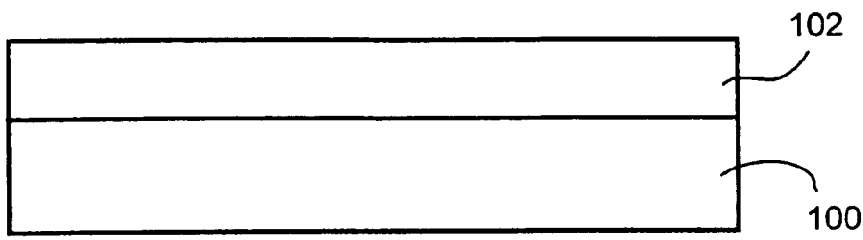
FIG. 4 is a side view of a semiconductor substrate illustrating an interim point in an in-situ semiconductor component on a silicon-on-insulator (SOI) wafer fabrication process in accordance with the present invention.

Referring specifically to FIG. 4, a substrate or wafer 100 (hereinafter referred to as a substrate for convenience) is provided. In this preferred embodiment, substrate 100 is single crystal (i.e. crystalline) silicon. A first layer 102 of crystalline rare earth insulator material is epitaxially grown on the surface of substrate 100. Single crystal rare earth oxides and rare earth nitrides, as well as other rare earth insulator materials, can be grown on silicon substrates with a (111), (001), or (110) crystalline orientation, and on Si (001) oriented substrates miscut between 1-6 degrees. These rare earth forms of insulator material posses unique qualities, e.g., single crystal morphology, large intrinsic energy band gap, and high dielectric constant. The binary rare earth oxide and rare earth nitride can be alloyed with Si to form ternaries which modify electrical and structural characteristics, such as, band gap energy and lattice constant, respectively. Similarly a rare earth oxynitride can be tailored by introducing various amounts of oxygen into the binary nitride and vice versa. This technique allows the growth of strain graded or lattice mismatched pseudo-substrates with lattice constants larger or smaller than bulk unstrained silicon.

While any of the materials known as 'rare earths' can be used, two preferred examples are Erbium (Er) and Ytterbium (Yb). Other typical examples of rare earth materials that can be used in this application are described in U.S. Provisional Application No. 60/533,378, filed 29 Dec. 2003, incorporated herein by reference. All of the above described materials (e.g. rare earth oxide, rare earth nitride, rare earth oxynitride, etc.) are referred to in this disclosure generally as "rare earth insulators" or as "rare earth insulator materials".

In this preferred embodiment, the crystalline rare earth insulator material of layer 102 has a crystal lattice that matches closely with the crystal lattice of silicon substrate 100 so that substantial stress is not developed. As will be understood presently, crystalline rare earth insulator material layer 102 will become the buried oxide (BOX) insulator layer for the SOI component. Because layer 102 is grown epitaxially, the thickness can be controlled very accurately and there is virtually no limit on the thickness.

Figure 5:
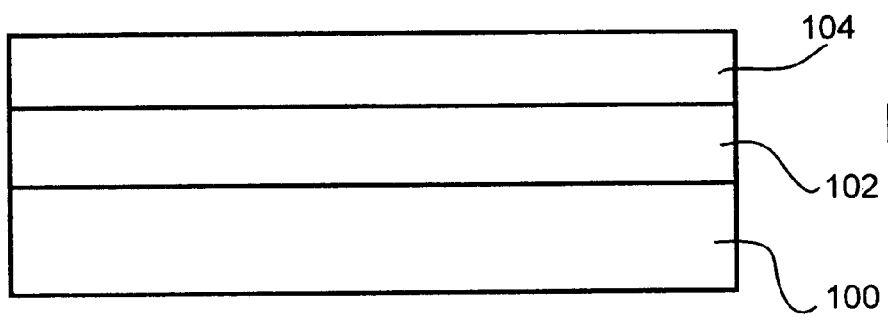
FIGS. 5, 6, and 7 are views similar to FIG. 4 illustrating additional epitaxial growth steps in the fabrication process.

Referring additionally to FIG. 5, an ultra-thin (<500 Å) layer 104 of crystalline silicon is epitaxially grown on the surface of crystalline rare earth insulator material layer 102. Epitaxial single crystal Si deposited on crystalline rare earth insulator material exhibits excellent structural properties. Also, because of the close crystal lattice matching, single crystal or crystalline silicon can be epitaxially grown on rare earth insulator material layer 102 with little or no stress in the layer. Silicon layer 104 will be good quality, low or no defect crystalline silicon and will be used as the channel for the semiconductor components. Because layer 104 is grown epitaxially, the thickness can be controlled within angstroms so that a fully depleted channel can be formed relatively easily for field effect transistors and the like.

Figure 6:
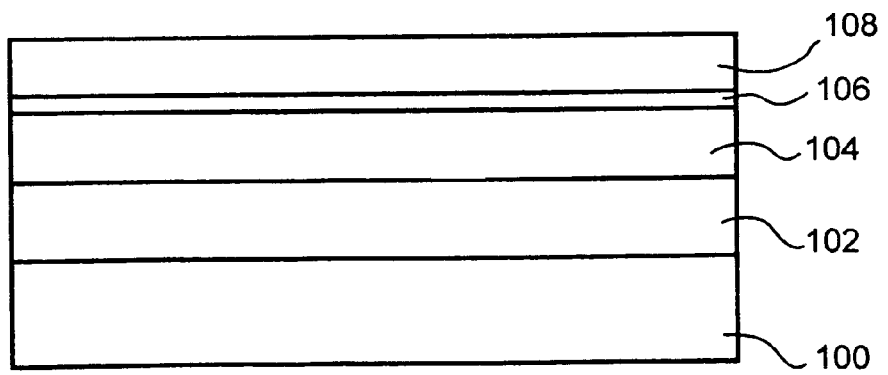

Referring to FIG. 6, a very thin layer 106 of crystalline rare earth oxide is epitaxially grown on the surface of crystalline silicon layer 104. Generally, layer 106 will be chosen to be a high-K insulating layer but could, in some applications be a $SiO_2$. Thin layer 106 of crystalline rare earth oxide is used as a gate oxide layer and is a better insulator than simple silicon dioxide. Because of the better insulating characteristics layer 106 can be made thinner while still reducing any gate leakage current. A layer 108 of crystalline or polycrystalline silicon is epitaxially grown on the upper surface of layer 106 and, as will be understood presently, will be formed into a gate contact stack.

Figure 7:
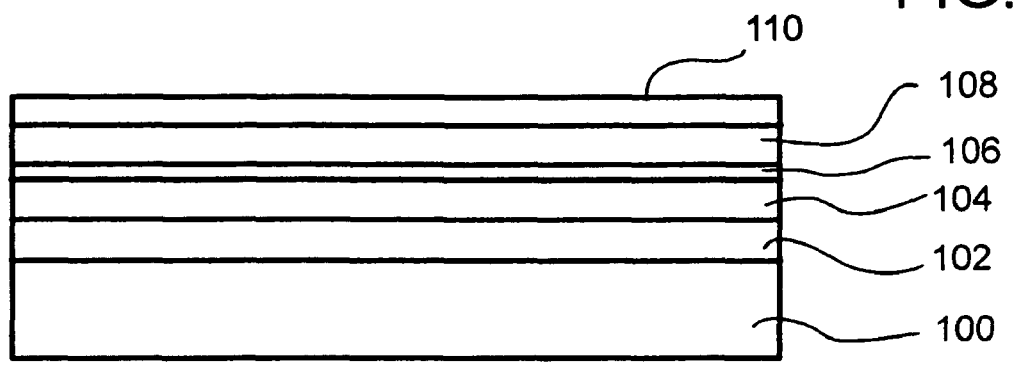

Turning to FIG. 7, a layer 110 composed of a rare earth silicide superlattice is epitaxially grown on the surface of silicon layer 108. The rare earth silicide is a conductor that allows electrical connection to the gate stack. Layer 110, in some applications may be formed of a single crystal silicon boron doped gate contact layer. In the even that a boron doped gate stack is provided, a nitrogen profile can readily be incorporated into gate oxide layer 106 to form, for example an erbium oxynitride layer which can be used to prevent boron and/or impurity diffusion into the junction between layers 106 and 104.

As explained briefly above, the structure illustrated in FIG. 7 is epitaxially grown, preferably in-situ (i.e. without removing the structure from the epitaxial chamber) and in a continuous integrated sequence. Growth temperatures for each step can be individually optimized for specific requirements in layer quality and in-situ high temperature anneals can be performed at temperatures up to 950° C.

Figure 8:
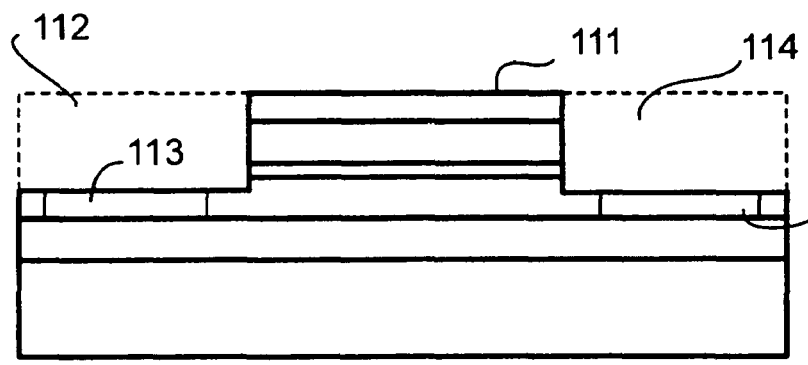
FIG. 8 is a simplified view of the semiconductor substrate of FIG. 7 illustrating an additional step in the fabrication process.
Figure 9:
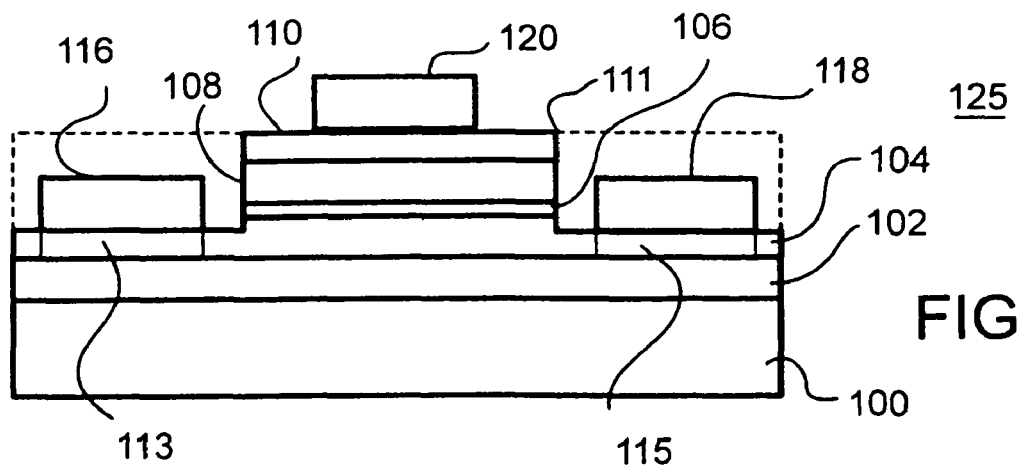
FIG. 9 is a side view of a semiconductor field effect transistor fabricated in accordance with the process of the present invention.

Turning to FIG. 8, the epitaxially grown structure of FIG. 7 is removed from the epitaxial chamber and, after masking the gate stack (designated 111), is etched by any well known process to expose a drain region 112 and a source region 114 and to define field effect transistor 125. A portion, designated 113, of drain region 112 is doped to produce a first type of conduction (e.g. N or P) and a portion, designated 115, of source region 114 is doped to produce a second type of conduction (e.g. P or N). The doping can be accomplished by well known diffusion or low energy implant techniques. Also, the doped regions extend downwardly to the rare earth insulator layer 102 to provide a fully depleted conduction channel. Metal contacts 116 and 118 are then deposited in drain and source regions 112 and 114, respectively. Also, a gate metal contact 120 is deposited on the upper surface of gate stack 111 to form contacts for field effect transistor 125. It will be understood that if a plurality of semiconductor components are formed on substrate 100, additional etching may be required to define and separate the various components. For example, field effect transistor 125 may be a component in a CMOS circuit and/or a ULSIC, and some masking and etching will be required to separate the various components and circuits.

Thus, new and improved semiconductor components are disclosed that are fabricated using the new and improved method of fabricating semiconductor components in-situ (i.e. without removing the structure from the epitaxial chamber) and in a continuous integrated sequence. The new and improved fabrication method does not use ion implantation of oxygen or nitrogen (or even both) through the surface of a bulk Si substrate or the bond and etch back technology which combines implantation with wafer bonding. The new and improved fabrication method utilizes epitaxially grown rare earth insulating materials and epitaxially grown semiconductor materials with improved characteristics and with fewer or no impurities and imperfections. Also, the new and improved fabrication method is easier and less work concentrated then prior art SOI methods.

Thus, new and improved semiconductor-on-insulator semiconductor components have been disclosed. The new and improved semiconductor-on-insulator semiconductor components may be used, generally, in a large variety of semiconductor products including CMOS and ULSICs. Because of the improved insulating characteristics of the rare earth insulator materials and because of the ability to control various characteristics of each layer in a semiconductor component (e.g. thickness and high K dielectric gate oxides) further scaling or reduction in size of CMOS architecture is possible.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A semiconductor-on-insulator field effect transistor comprising:
   a single crystal silicon substrate;
   a buried insulator layer of rare earth insulator material on the semiconductor substrate, the buried insulator layer of rare earth insulator material including a rare earth oxynitride tailored to produce a lattice constant one of larger or smaller than the lattice constant of the silicon substrate, whereby the buried insulator layer forms a strain graded or lattice mismatched pseudo-substrate;
   a channel layer of single crystal silicon on the buried insulator layer of rare earth insulator material;
   a gate insulator layer of rare earth insulator material on the channel layer;
   a gate stack of silicon on the gate insulator layer;
   a drain region in the channel layer adjacent one side of the gate stack with a portion of the channel layer in the drain region being doped for conduction;
   a source region in the channel layer adjacent an opposite side of the gate stack with a portion of the channel layer in the source region being doped for conduction, the doping in both the drain region and the source region extending through the channel layer to the buried insulator layer to provide a fully depleted channel layer; and
   a metal gate contact on the gate stack, a metal drain contact on the doped portion of the channel layer in the drain region, and a metal source contact on the doped portion of the channel layer in the source region.

2. A semiconductor-on-insulator field effect transistor comprising:
   a single crystal silicon substrate;
   a buried insulator layer of rare earth insulator material on the semiconductor substrate, the buried insulator layer of rare earth insulator material including a rare earth oxynitride tailored to produce a lattice constant one of larger or smaller than the lattice constant of the silicon substrate, whereby the buried insulator layer forms a strain graded or lattice mismatched pseudo-substrate;
   a channel layer of single crystal silicon on the buried insulator layer of rare earth insulator material;
   a gate insulator layer of rare earth insulator material on the channel layer, the gate insulator layer including a rare earth oxynitride, whereby the rare earth oxynitride layer prevents doping diffusion into the channel layer;
   a gate stack of silicon on the gate insulator layer, the silicon stack including doping to provide a selected type of conductance, the gate stack including a layer of rare earth silicide contact material deposited on the silicon;
   a drain region in the channel layer adjacent one side of the gate stack with a portion of the channel layer in the drain region being doped for conduction;
   a source region in the channel layer adjacent an opposite side of the gate stack with a portion of the channel layer in the source region being doped for conduction, the doping in both the drain region and the source region extending through the channel layer to the buried insulator layer to provide a fully depleted channel layer; and
   a metal gate contact on the silicide contact layer of the gate stack, a metal drain contact on the doped portion of the channel layer in the drain region, and a metal source contact on the doped portion of the channel layer in the source region.

* * * * *